(12) United States Patent
Shinohara et al.

(10) Patent No.: US 6,620,288 B2
(45) Date of Patent: Sep. 16, 2003

(54) SUBSTRATE TREATMENT APPARATUS (75) Inventors: Hisato Shinohara, Yamanashi (JP); Naoto Kusumoto, Kanagawa (JP); Masato Yonezawa, Kanagawa (JP)

(73) Assignees: Semiconductor Energy Laboratory Co., Ltd., Kanagawa-ken (JP); TDK Corporation, Tokyo (JP)

( * ) Notice: Subject to any disclaimer, the term of this patent is extended or adjusted under 35 U.S.C. 154(b) by 0 days.

(21) Appl. No.: 09/812,327

(22) Filed: Mar. 19, 2001

(65) Prior Publication Data
US 2002/0020496 A1 Feb. 21, 2002

(30) Foreign Application Priority Data
Mar. 22, 2000 (JP) ......................................... 2000-079552

(51) Int. Cl.$^7$ ........................ H01L 21/306; C23C 16/00; C23C 14/34
(52) U.S. Cl. ..................... 156/345.29; 156/345.33; 118/718; 118/719; 204/298.07; 204/298.24; 204/298.25; 204/298.33; 204/298.35
(58) Field of Search ................ 204/298.07, 298.24, 204/298.25, 298.33, 298.35; 118/718, 719; 156/345, 345.29, 345.33

(56) References Cited

U.S. PATENT DOCUMENTS

| 3,650,042 A | * | 3/1972 | Boerger et al. | ............. 118/718 |
| 4,410,558 A | | 10/1983 | Izu et al. | ...................... 438/62 |
| 4,479,455 A | | 10/1984 | Doehler et al. | ............. 112/718 |
| 4,519,339 A | | 5/1985 | Izu et al. | ..................... 118/718 |
| 4,520,757 A | | 6/1985 | Nath et al. | ................ 118/723 E |
| 4,920,917 A | * | 5/1990 | Nakatani et al. | ............. 118/718 |
| 4,949,669 A | * | 8/1990 | Ishii et al. | ................... 118/719 |

FOREIGN PATENT DOCUMENTS

| JP | 59-034668 | | 2/1984 |
| JP | 63-1220428 | * | 5/1988 |
| JP | 5-156442 | * | 6/1993 |
| JP | 09-107116 | | 4/1997 |

* cited by examiner

Primary Examiner—Rodney G. McDonald
(74) Attorney, Agent, or Firm—Fish & Richardson, P.C.

(57) ABSTRACT

In the substrate treatment apparatus including substrate treatment chambers (301 and 303) and a buffer chamber (302) having an exhaust system (306*b*) independent of the substrate treatment chambers, connection tubes (304*a* and 304*b*) are provided between the substrate treatment chambers and the buffer chamber, and gas inlets are respectively provided for the connection tubes. A gas (308) for treating a substrate flows from the connection tube (304*a*) into the substrate treatment chamber (301) and the buffer chamber (302), while a gas (309) for treating a substrate flows from the connection tube (304*b*) into the substrate treatment chamber (303) and the buffer chamber (302). Accordingly, the gas does not move from the substrate treatment chamber to the buffer chamber against a gas flow, thereby allowing the separation between ambiences.

16 Claims, 7 Drawing Sheets

SUBSTRATE TREATMENT APPARATUS

BACKGROUND OF THE INVENTION

1. Field of the Invention

The present invention relates to a substrate treatment apparatus for forming electronic devices such as a thin film solar battery, particularly to a substrate treatment apparatus characterized in that a gas inlet is provided at a connection tube between a treatment chamber and a buffer chamber.

2. Description of the Related Art

Recently, in view of mass production of thin film solar batteries, a low-cost manufacture process for the thin film solar battery has been expected to be developed. As one means for reducing the manufacture cost, a method of continuously conducting unit operations such as film formation, printing and laser processing in an inline manner while rewinding a rolled-up flexible substrate around another roll is known. Such a method of continuously conveying a flexible substrate from one end to another is referred to as a Roll-to-Roll method. Particularly, the Roll-to-Roll method is generally used as means for continuously forming a semiconductor thin film such as a non-single crystalline silicon film on a flexible substrate (for example, a polymer film, a metal thin film and the like). The non-single crystalline silicon includes amorphous silicon, microcrystalline silicon and thin film polycrytalline silicon.

A Roll-to-Roll film formation apparatus is generally constituted to have a multi-chamber system including a plurality of film formation chambers in addition to a loading chamber and an unloading chamber. It is a long-shaped flexible substrate that is to be dealed in the Roll-to-Roll method film formation apparatus while being continuously conveyed. Accordingly, a gate valve for separating vacuum chambers from each other cannot be used. Therefore, if a film formation process is conducted in a film formation apparatus in which vacuum chambers are provided in a continuous manner, a gas degassed from a flexible substrate and a material gas used in each of the film formation chambers enter an adjacent film formation chamber to cause cross contamination, resulting in degradation of the quality of a semiconductor film.

Figure 1:
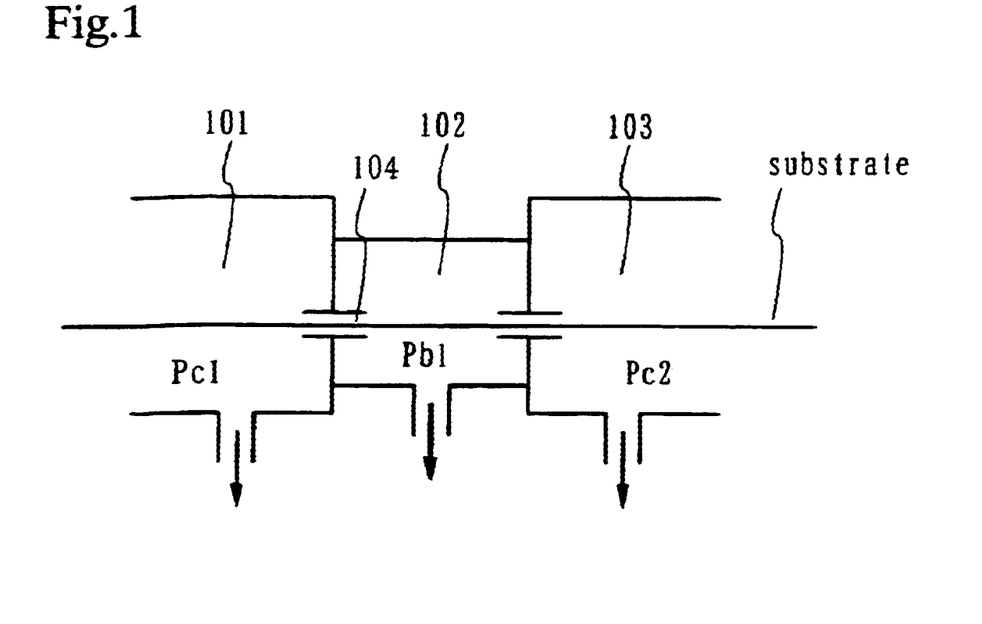
FIG. 1 shows a buffer chamber and an independent exhaust system.

A conventional method of preventing the cross contamination is disclosed in Japanese Patent Application Laid-Open No. Sho 59-34668. According to this method, a buffer chamber is provided between film formation chambers. An exhaust system, which is independent of each of the film formation chambers, is connected to the buffer chamber so as to obtain a higher degree of vacuum than that in the film formation chambers for controlling the ambience. FIG. 1 shows a conventional ambience separation method in which a buffer chamber is provided between film formation chambers. A buffer chamber 102 is provided between film formation chambers 101 and 103. Assuming that ambient pressures in the film formation chambers 101 and 103 are respectively Pc1 and Pc2 and an ambient pressure in the buffer chamber 102 is Pb1, the relationship: Pc1, Pc2>Pb1 is established. It is desirable that a pressure in the buffer chamber 102 is one-tenth or less of that in the film formation chambers 101 and 103 upon film formation. The method described above prevents the cross contamination that a material gas for film formation introduced into each of the film formation chambers enters the adjacent film formation chamber. Although most of the material gas for film formation flowing into the buffer chamber is exhausted from the buffer chamber through an exhaust system of the buffer chamber, a means free path of gas molecules is long due to retention of a high vacuum, resulting in a problem that the ambience control is not sufficient in the buffer chamber by itself. Moreover, since a material gas for film formation flows from the film formation chamber containing a large amount of dust into the buffer chamber, this ambience separation method has such a structure that the dust is likely to be introduced along with the material gas flow. Accordingly, there arises another problem that dust more frequently adheres onto a substrate on which a film is to be formed, such as a flexible substrate.

Figure 2:
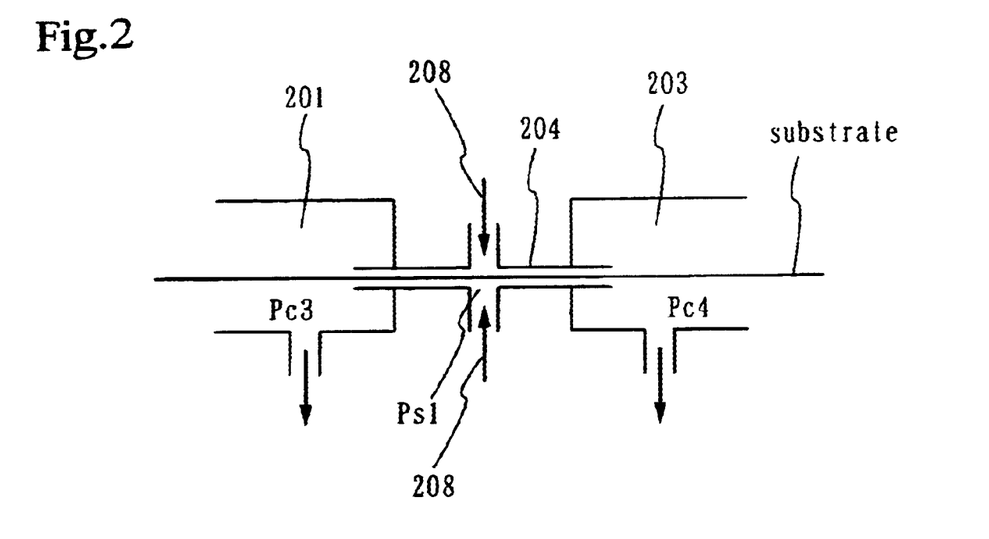
FIG. 2 shows a connection tube and an inert gas inlet tube.

Another method of preventing the cross contamination is disclosed in Japanese Patent Application Laid-Open No. Hei 9-107116. A connection tube (substantially, a buffer chamber) having an opening of the minimum cross-sectional size that allows a substrate for treatment to pass therethrough is provided between film formation chambers. An inert gas (hydrogen or rare gas) is introduced into the connection tube. FIG. 2 shows a conventional structure in which an inert gas is introduced through a connection tube that connects film formation chambers with each other for controlling the ambience. An inert gas 208 flows from a connection tube 204 into film formation chambers 201 and 203. Assuming that ambient pressures in the film formation chambers 201 and 203 are respectively Pc3 and Pc4 and an ambient pressure in the connection tube 204 is Ps1, the relationship: Ps1>Pc3, Pc4 is established. According to this method, ambience control for each of the film formation chambers is effective. Moreover, the adherence of dust onto a substrate on which a film is formed is less. However, the inert gas mixes with a plasma for film formation to alter the quality of a semiconductor film. Although the inert gas is essentially inert, it acts as an impurity in the semiconductor film to alter physical properties such as electrically conductive properties.

SUMMARY OF THE INVENTION

In view of the above problems, the present invention has an object of conducting ambience separation between substrate treatment chambers in a substrate treatment apparatus including a plurality of substrate treatment chambers for continuously treating a substrate so as to prevent cross contamination, thereby preventing the degradation of the quality of a semiconductor film and the substrate treatment capacity due to enter of a gas different from the material gas into the substrate treatment chamber.

The present invention provides a substrate treatment apparatus including at least one treatment chamber and at least one buffer chamber having an exhaust system that is independent of the treatment chamber, wherein a connection tube is provided between the treatment chamber and the buffer chamber; and a gas inlet is provided for the connection tube. The connection tube has an opening of the minimum cross-sectional size that allows a substrate to be treated to pass therethrough.

Figure 3:
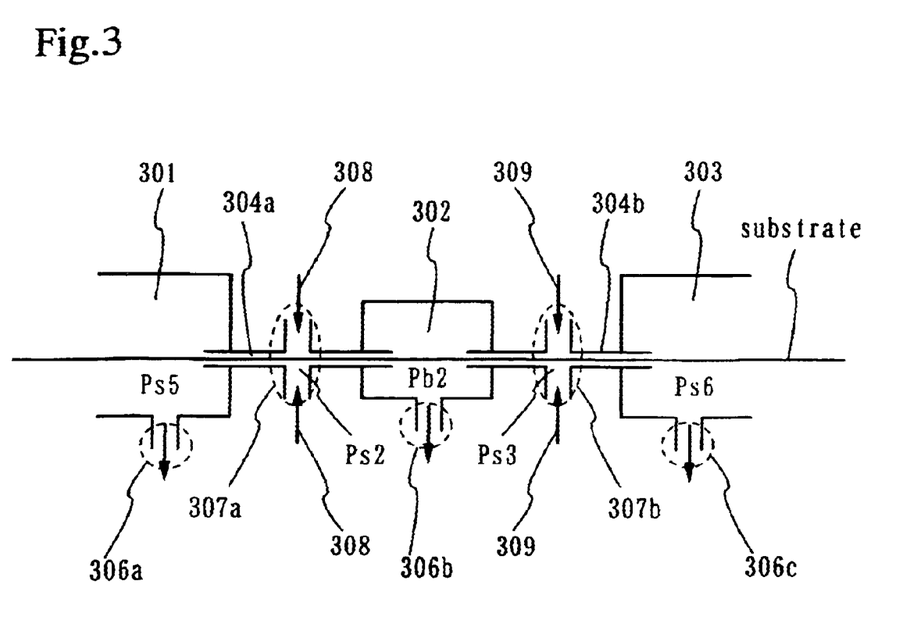
FIG. 3 shows a novel structure for introducing a gas to be used in an adjacent substrate treatment chamber into a connection tube.

FIG. 3 shows a structure for separation between substrate treatment chambers in one embodiment of the present invention. A buffer chamber 302 for ambience separation is provided between substrate treatment chambers 301 and 303. The substrate treatment chambers 301 and 303 and the buffer chamber 302 are connected to each other through connection tubes 304a and 304b respectively having inlet tubes 307a and 307b for a substrate treatment gas. The present invention is characterized in that the gas to be introduced through the connection tubes 304a and 304b is a gas for substrate treatment that is required in an adjacent substrate treatment chamber. For example, an introduced gas 308 is a gas used in the substrate treatment chamber 301, and an introduced gas 309 is a gas used in the substrate treatment chamber 303. The present invention makes it possible to treat a highly pure semiconductor film without altering an ambient composition in the substrate treatment chambers. Assuming that ambient pressures in the substrate treatment chambers 301 and 303 are respectively Pc5 and Pc6, ambient pressures in the connection tubes 304a and 304b are respectively Ps2 and Ps3, and an ambient pressure in the buffer chamber 302 is Pb2, the relationship: Ps2, Ps3>Ps5, Ps6>Pb2 is established. Based on this relationship of the pressure, the gas 308 for substrate treatment flows from the connection tube 304a into the substrate treatment chamber 301 and the buffer chamber 302, while the gas 309 for substrate treatment flows from the connection tube 304b into the substrate treatment chamber 303 and the buffer chamber 302. Therefore, the movement of dust from the substrate treatment chambers that contain a large amount of dust toward the buffer chamber never occurs against the gas flow. As a result, the adherence of dust onto the substrate to be treated becomes less.

The application of an ambience separation method of the present invention is not limited to a plasma treatment apparatus that is a plasma CVD apparatus, a sputtering apparatus, a plasma etching apparatus, or the combination of thereof. The ambience separation method of the present invention is also effective in a substrate treatment apparatus such as a thermal CVD apparatus and an evaporation apparatus in the case where ambience separation is required to be performed so as to continuously treat a substrate.

DESCRIPTION OF THE PREFERRED EMBODIMENTS

Hereinafter, embodiments of the present invention will be described. A plasma CVD process in an n-layer film formation chamber, a buffer chamber and an i-layer film formation chamber is described with reference to FIG. 3, taking a plasma CVD apparatus for manufacturing a solar battery as an example. A plasma treatment chamber 301 is an n-layer film formation chamber, and a plasma treatment chamber 303 is an i-layer film formation chamber. A material gas 308, $SiH_4+H_2+PH_3$, is supplied to the n-layer film formation chamber 301 through a connection tube 307a and simultaneously, the material gas 308 flows into a buffer chamber 302. On the other hand, a material gas 309, $SiH_4+H_2$, is supplied to the i-layer film formation chamber 303 through a connection tube 307b, and simultaneously flows into the buffer chamber 302. Most of the material gases 308 and 309 flowed to the buffer chamber 302 are exhausted from the buffer chamber 302 by an independent exhaust system 306b. Since the material gases 308 and 309 flow into the buffer chamber 302 through the connection tubes 307a and 307b, respectively, the material gases 308 and 309 that once flow into the buffer chamber 302 do not reflow into the film formation chambers 301 and 303 against the gas flow within the connection tubes 307a and 307b. Although the material gases 308 and 309 are supplied to the film formation chambers 301 and 303 through the connection tubes 307a and 307b, respectively, a supply port for the material gas may be separately provided in each of the film formation chambers.

Embodiment 1

Figure 4:
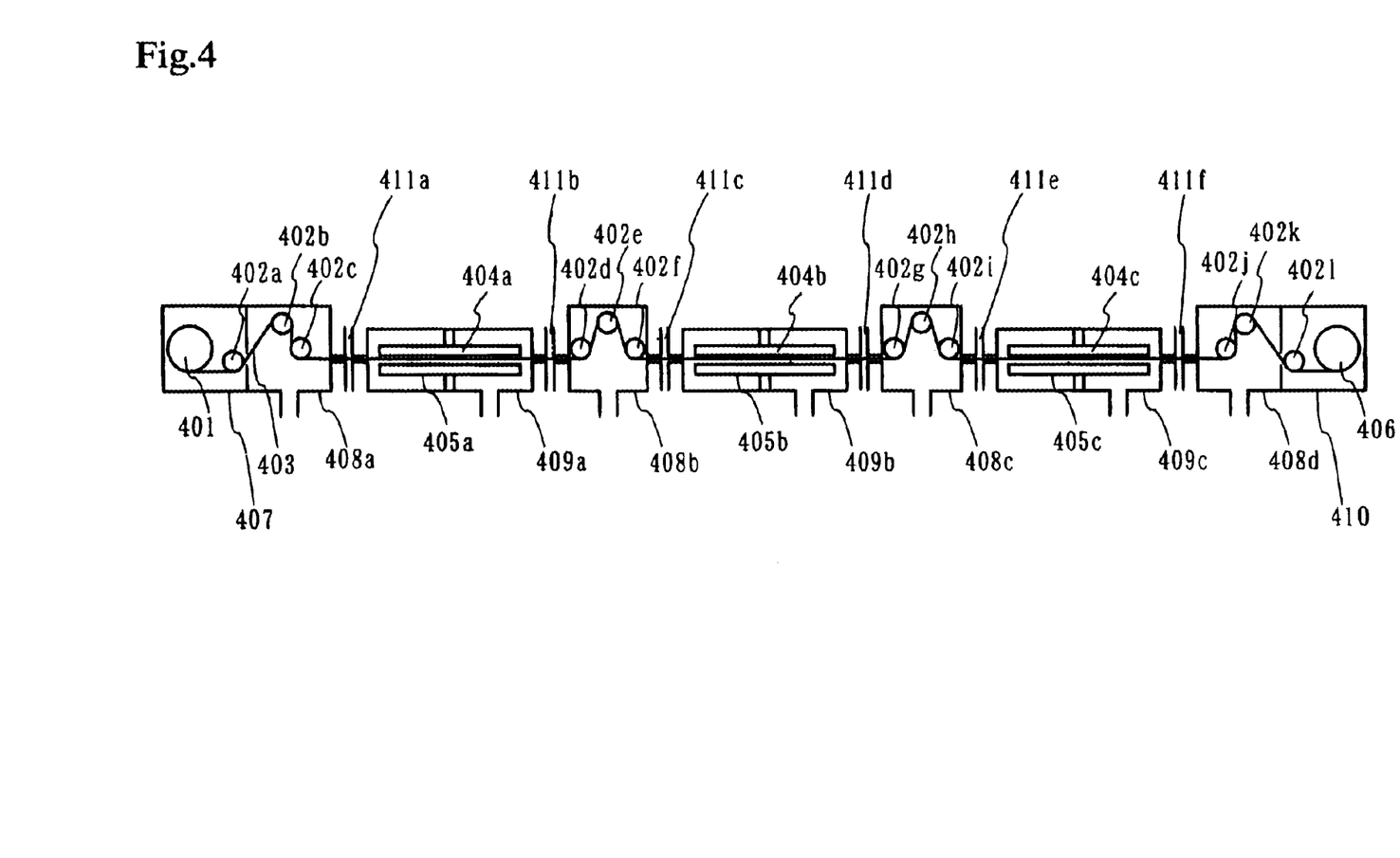
FIG. 4 shows a Roll-to-Roll plasma treatment apparatus.

Embodiments of the present invention will be described with reference to the drawings. FIG. 4 shows a Roll-to-Roll multi-chamber plasma treatment apparatus employing a plasma treatment chamber separation method. First, this embodiment will be described, assuming that the apparatus shown in FIG. 4 is used for manufacturing a solar battery. Although a plasma electrode of a parallel plate type plasma is used for the apparatus in FIG. 4, the structure of the plasma electrode is not limited thereto. The similar effects can be obtained even when a plasma electrode of can type or a curved roller type is used.

In FIG. 4, the Roll-to-Roll multi-chamber plasma treatment apparatus includes an unwinding roll 401, guide rollers 402a to 402l, a PEN (polyethylene naphthalate) film 403 that is a flexible substrate on which a film is to be formed, pairs of electrodes 404a to 404c and 405a to 405c of plasma CVD for forming amorphous silicon films respectively having p-type, i-type and n-type conductivities, and a winding roll 406 for winding a film formed of amorphous silicon having each conductivity. Buffer chambers 408a to 408d and connection tubes with material gas inlets 411a to 411f according to the structure of the present invention are provided between a loading chamber 407, film formation chambers 409a to 409c, and an unloading chamber 410, respectively. The film formation chambers 409a to 409c are for forming films made of amorphous silicon respectively having n-type, i-type and n-type conductivities. A material gas $SiH_4+H_2+PH_3$ is introduced from the material gas inlets 411a and 411b, a material gas $SiH_4+H_2$ is introduced from the material gas inlets 411c and 411d, and a material gas $SiH_4+H_2+B_2H_6$ from the material gas inlets 411e and 411f.

A pressure in the film formation chambers upon film formation is 133 Pa, whereas a pressure in the buffer chambers is 10 Pa because the buffer chambers are independent vacuum systems. The material gases are introduced to the respective film formation chambers through the connection tubes from the material gas inlets that are connected to the both side of the film formation chambers to form amorphous silicon films having the respective conductivities. On the other hand, the material gases also flow through the connection tubes into the buffer chambers which are provided so as to oppose to the respective film formation chambers, and are then exhausted from the buffer chambers by the independent vacuum systems. Since molecules of the material gases flowing into the buffer chambers do not reflow into the plasma chambers against the gas flow within the connection tubes, impurities do not enter so that an ambience in each of the film formation chambers is held constant. In addition, since the gas flows in the direction from the buffer chamber to the film formation chamber, the occurrence of adherence of the dust onto the flexible substrate can be restrained.

In this embodiment, the amorphous silicon film is formed of a highly pure material gas in each of the film formation chambers, while allowing the adherence of the dust onto the substrate to be restrained. Although the multi-chamber plasma CVD apparatus has been described as an example in this embodiment, it is apparent that the present invention is applicable to single layer formation or reciprocating multi-layer formation in a single chamber, a sputtering apparatus or the like. In addition to formation of a solar battery, the present invention is also effective to form a silicon active layer of a TFT or the like.

Embodiment 2

Another embodiment of the present invention will be described, assuming that FIG. 4 shows a Roll-to-Roll sputtering apparatus. In a film formation chamber 409a, a film of aluminum is formed by sputtering. First, an argon gas is introduced from gas inlets 411a and 411b on connection tubes so that the film formation chamber 409a is made in an argon gas ambience. Next, an ambient gas pressure is adjusted to 67 Pa, and then, electric power is applied across a pair of electrodes 404a and 405a so as to generate a plasma. In a film formation chamber 409b, an ITO film is formed by sputtering. Upon film formation, an argon gas and oxygen are introduced from gas inlets 411c and 411d so that the film formation chamber 409b is made in an ambience of a mixed gas of an argon gas and oxygen. A gas pressure upon film formation is 67 Pa. A buffer chamber 408b is provided between the film formation chambers 409a and 409b. The buffer chamber 408b and the film formation chambers 409a and 409b are connected to each other through connection tubes with gas inlets. The pair of electrodes 404b and 405b are for generating a plasma.

If the gases respectively introduced to the film formation chambers 409a and 409b mix with each other to alter a ambient composition which is necessary for each of the film formation chambers, the quality of the aluminum film and the ITO film formed by sputtering, such as a conductivity, is altered. Particularly, with respect to the aluminum film, if oxygen enters the ambience, its conductivity is lowered. As a result, a desired high conductivity cannot be obtained.

However, by providing the connection tubes and the buffer chamber 408b between the film formation chambers 409a and 409b and using the method of introducing a gas from the gas inlet provided for the connection tube according to the present invention, ambiences in the respective chambers are separated from each other. The ambiences are separated so that the film formation chamber 409a is in an argon gas ambience and the film formation chamber 409b is in a mixed gas ambience of an argon gas and oxygen. Consequently, an ambient composition necessary for each of the film formation chambers can be obtained. Furthermore, the quality of the formed aluminum film or ITO film, such as a conductivity, is not altered, resulting in a film having the desired quality.

Embodiment 3

Another embodiment of the present invention will be described below. A non-single crystalline silicon film over a flexible substrate shown in FIGS. 5A to 5C is continuously processed using the Roll-to-Roll plasma treatment apparatus shown in FIG. 4.

Figure 5A:
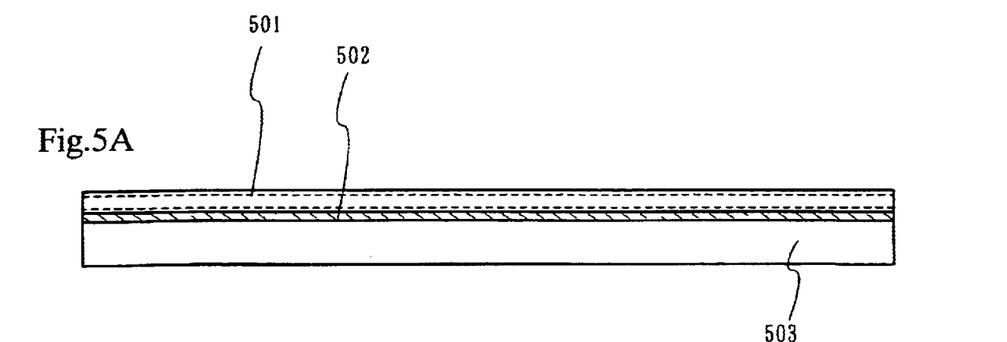
FIGS. 5A to 5C show a non-single crystalline silicon film on a flexible substrate.
Figure 5B:
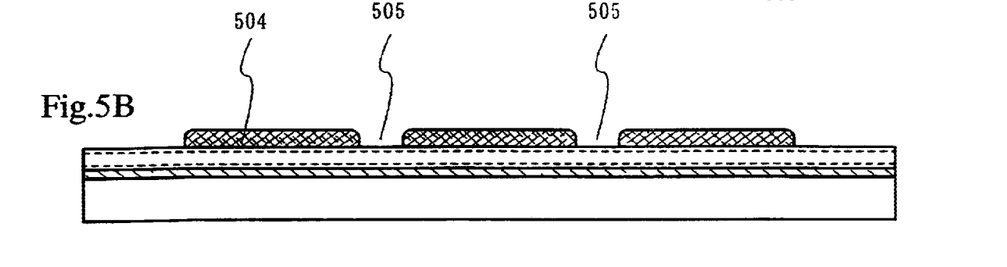
Figure 5C:
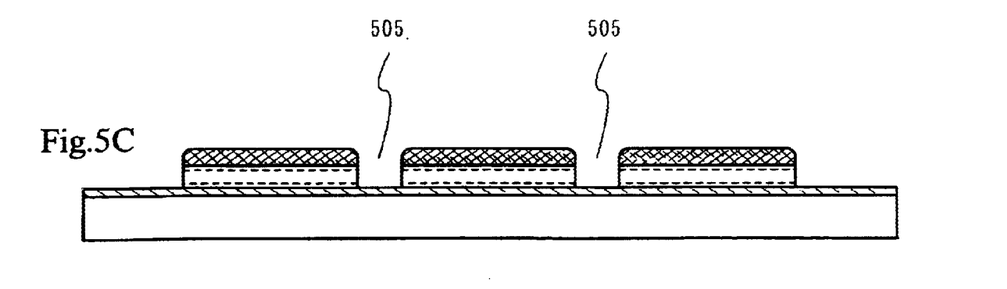

First, a flexible substrate 503 as shown in FIG. 5A is prepared, and is then rolled up. On the flexible substrate 503, a metal electrode 502 and a non-crystalline silicon film 501 are deposited.

The plasma treatment apparatus shown in FIG. 4 includes a sputtering chamber 409a for forming an ITO film by sputtering and a plasma etching chamber 409b for a non-single crystalline silicon film using $CF_4+O_2$. The buffer chamber 408b is provided between the sputtering chamber 409a and the plasma etching chamber 409b. The sputtering chamber 409a and the buffer chamber 408b, and the buffer chamber 408b and the plasma etching chamber 409b are respectively connected with each other through connection tubes with gas inlets. Pairs of electrodes 404a and 405a and 404b and 405b respectively are for generating a plasma. The flexible substrate 503 is placed in this apparatus. The flexible substrate 503 is unwound from the unwinding roller 401 and wound around the winding roller 406. In this manner, the flexible substrate 503 is continuously processed while being conveyed.

An ITO film is formed by using a mask or the like in the ITO sputtering chamber 409a. Upon film formation, an argon gas and oxygen are introduced from the gas inlets 411a and 411b on the connection tubes so that the ITO sputtering chamber 409 is in a mixed gas ambience of an argon gas and oxygen. A pressure upon film formation is set to 67 Pa. After such film formation, a structure as shown in FIG. 5B can be obtained. In FIG. 5B, the reference numeral 504 designates ITO, and the reference numeral 505 designates openings of the ITO in which the ITO is not formed due to the presence of the mask.

Plasma etching for a non-single crystalline silicon film is conducted by using a plasma of $CF_4+O_2$ in the plasma etching chamber 409b. Upon etching, $CF_4$ and oxygen ($O_2$) are introduced from the gas inlets 411c and 411d so that the plasma etching chamber 409b is in a mixed gas ambience of $CF_4$ and oxygen. A pressure upon etching is 100 Pa. Through the plasma etching as described above, only the part of the non-single crystalline silicon layer which is situated under the openings 505 is etched to form a structure shown in FIG. 5C.

In this embodiment, if the gases respectively introduced into the sputtering chamber 409a and the plasma etching chamber 409b mix with each other to alter an ambient composition which is necessary for each of the chambers 409a and 409b, the quality of the ITO film formed by sputtering, such as a conductivity, or the etching speed for the non-single crystalline silicon film and the like are altered. However, by providing the connection tubes and the buffer chamber 408b between the sputtering chamber 409a and the plasma etching chamber 409b and using the above-mentioned method of introducing a gas from the gas inlets provided for the connection tubes according to the present invention, the ambiences in the chambers 409a and 409b are separated from each other. Therefore, an ambient composition necessary for each of the treatment chambers can be obtained, that is, the sputtering chamber 409a is in a mixed gas ambience of an argon gas and oxygen and the plasma etching chamber 409b is in a mixed gas ambience of $CF_4$ and oxygen. Moreover, a desired process can be conducted without affecting the quality of the formed ITO film such as a conductivity and altering the etching speed for the non-single crystalline silicon film.

Embodiment 4

A further embodiment of the present invention will be described below. A non-single crystalline silicon film is continuously formed on a glass substrate with a transparent electrically conductive film by using a batch type plasma CVD apparatus shown in FIG. 6. Furthermore, an integrated solar battery is manufactured.

Figure 7A:
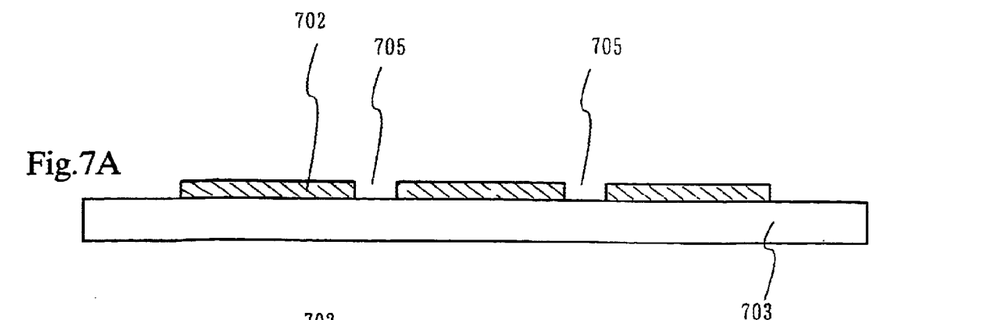
FIGS. 7A to 7D show a solar battery on a glass substrate with a transparent electrically conductive film.

First, a glass substrate 703 with a transparent electrically conductive film 702 as shown in FIG. 7A is prepared. The transparent electrically conductive film 702 having a double layered structure of ITO and SnO₂ is used in this embodiment. A thickness of ITO is 50 nm, and a thickness of SnO₂ is 20 nm. Openings 705 are provided through the transparent electrically conductive film 702 so as to divide the transparent electrically conductive film 702 in an island pattern.

Figure 6:
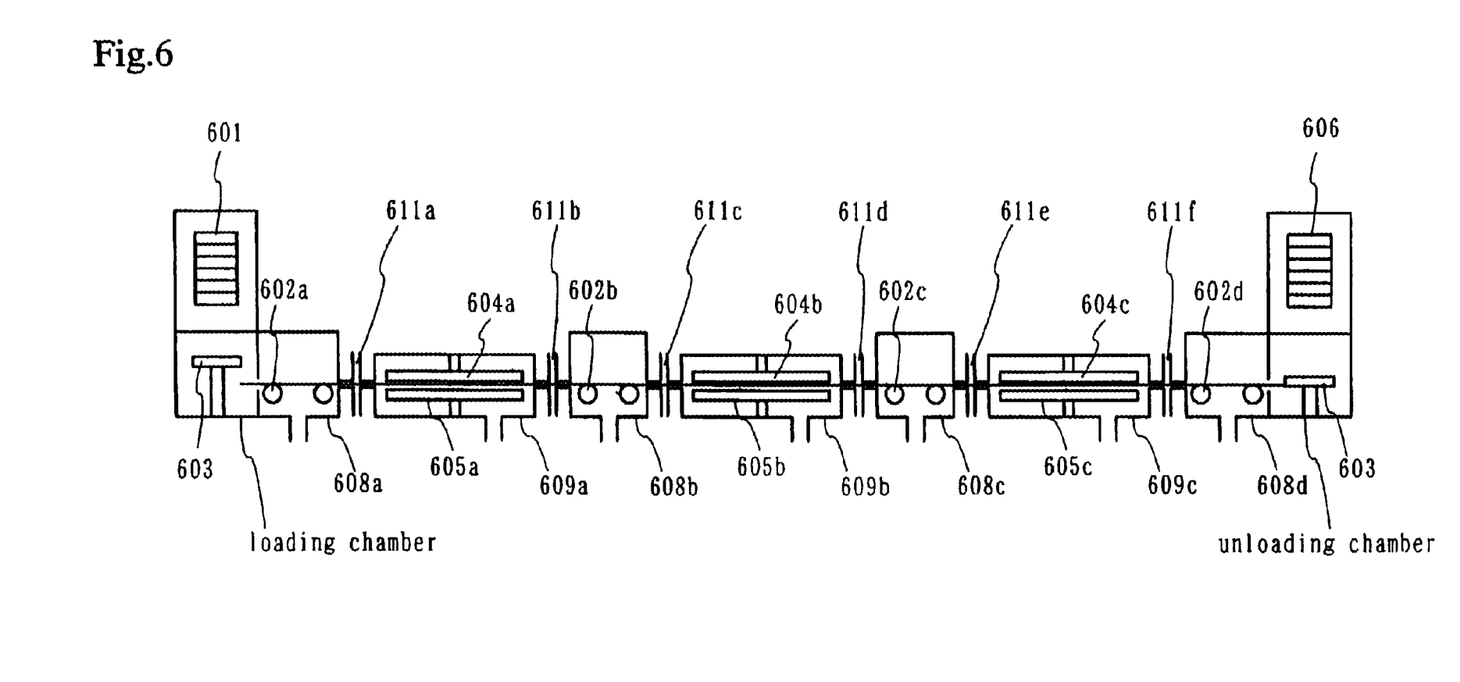
FIG. 6 shows a batch type plasma CVD apparatus.
Figure 7B:
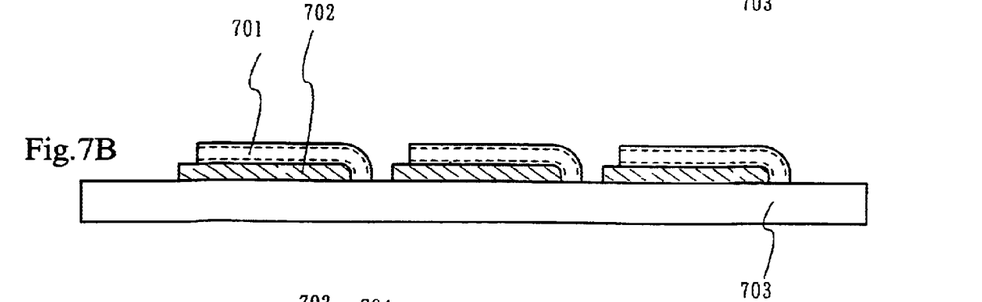

Next, the glass substrate 703 with the transparent electrically conductive film 702 is placed in a loading cassette 601 in the batch type plasma CVD apparatus shown in FIG. 6. At this time, a mask is provided on the glass substrate 703 so as to carry out patterning of the non-single crystalline silicon film after its formation. In the plasma CVD apparatus, a buffer chamber 608b is provided between film formation chambers 609a and 609b, while a buffer chamber 608c is provided between film formation chambers 609b and 609c. Moreover, the film formation chambers and the buffer chambers are connected with each other through connection tubes with gas inlets. Pairs of electrodes 604a and 605a, 604b and 605b, and 604c and 605c, respectively are provided for generating a plasma. A p-type non-single crystalline silicon layer is formed in the film formation chamber 609a, an i-type non-single crystalline silicon layer in the film formation chamber 609b, and an n-type non-single crystalline silicon layer in the film formation chamber 609c by a plasma CVD method while conveying the glass substrate 703 with the transparent electrically conductive film 702 by a substrate placement mechanism 603 and batch conveying mechanisms 602a to 602d. Upon film formation, $SiH_4+H_2+B_2H_6$ is introduced from gas inlets 611a and 611b on the connection tubes, $SiH_4+H_2$ is introduced from gas inlets 611c and 611d, and $SiH_4+H_2+PH_3$ is introduced from gas inlets 611e and 611f. Thickenesses of the p- and n-layers are 20 to 50 nm, and a thickness of the i-layer is 300 to 800 nm. After film formation, the glass substrate 703 is placed within an unloading cassette 606 by a substrate conveying mechanism. At this moment, the mask is removed from the glass substrate 703. Then, as shown in FIG. 7B, the glass substrate 703 on which the transparent electrically conductive film 702 and the non-single crystalline silicon film 701 are formed is obtained.

Figure 7C:
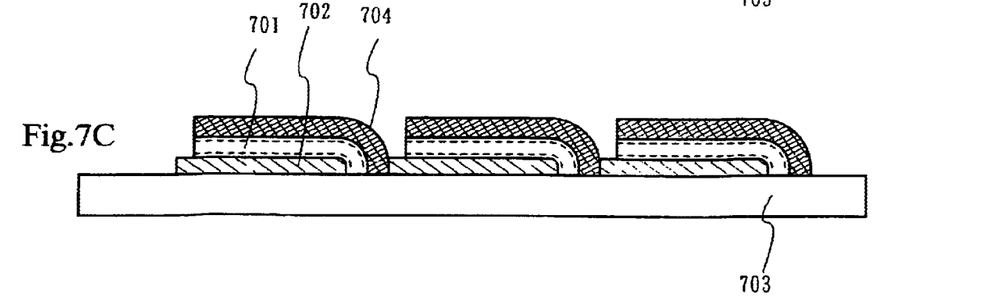
Figure 7D:
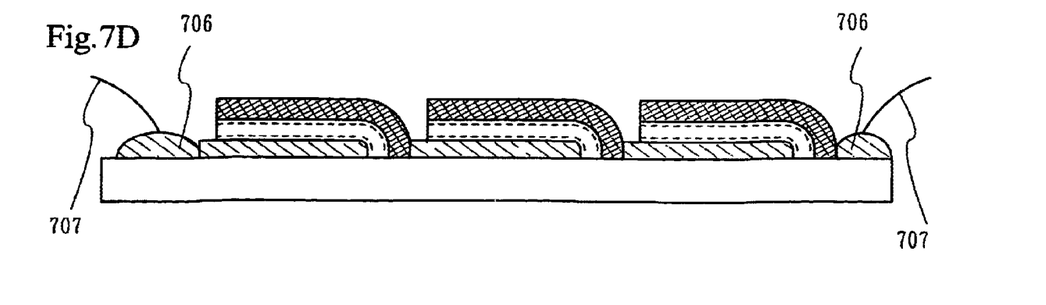

Furthermore, a back electrode 704 is formed sing a mask. Chromium is used as a material of the back electrode 704. A thickness of the back electrode 704 is 300 nm. Then, a structure of an integrated solar battery as shown in FIG. 7C is obtained. Thereafter, as shown in FIG. 7D, a lead electrode 706 is formed and a lead wire 707 is attached thereto to complete the integrated solar battery. An electrically conductive adhesive is used for the lead electrode 706.

In this embodiment, if the material gases respectively introduced into the film formation chambers 609a to 609c mix with each other to alter an ambient composition necessary for each of the film formation chambers, a large amount of impurity levels are formed particularly in the i-layer to cause degradation of the quality of the i-layer and remarkable reduction of the output characteristics of a solar battery. However, by providing the connection tubes and the buffer chambers between the film formation chambers and by introducing the material gases from the gas inlets provided for the connection tubes according to the present invention, the ambiences in the treatment chambers are separated from each other to obtain an ambient composition necessary for each of the film formation chambers. Moreover, the characteristics of the formed non-single crystalline silicon film, and further the output characteristics of a solar battery are not altered and the desired film formation can be performed.

In a substrate treatment apparatus including a plurality of substrate treatment chambers for continuously processing a substrate, a structure for introducing only a material gas to a connection tube according to the present invention is employed without using a special inert gas so as to more efficiently control the ambience in each of the substrate treatment chambers and to prevent dust from adhering onto the substrate. Furthermore, cross contamination is reduced to allow the prevention of degradation in the quality of a semiconductor film and in the substrate treatment capacity due to mixture of the material gas and a different type of gas in the substrate treatment chamber.

What is claimed is:

1. A substrate treatment apparatus comprising:
   at least first and second treatment chambers; and
   at least one buffer chamber comprising an exhaust system,
   wherein the buffer chamber is provided between the first and second treatment chambers,
   wherein a first connection tube comprising a first gas inlet is provided between the first treatment chamber and the buffer chamber, and a second connection tube comprising a second gas inlet is provided between the second treatment chamber and the buffer chamber,
   wherein a first composition of first gas introduced into the first connection tube from the first gas inlet is the same as a second composition of second gas which is necessary in the first treatment chamber,
   wherein a third composition of third gas introduced into the second connection tube from the second gas inlet is the same as a fourth composition of fourth gas which is necessary in the second treatment chamber,
   wherein the third composition is different from the first composition, and
   wherein the third gas and the fourth gas comprise oxygen.

2. A substrate treatment apparatus according to claim 1, wherein the substrate treatment apparatus is a sputtering apparatus.

3. A substrate treatment apparatus comprising:
   at least first and second treatment chambers; and
   at least one buffer chamber comprising an exhaust system,
   wherein the buffer chamber is provided between the first and second treatment chambers,
   wherein a first connection tube comprising a first gas inlet is provided between the first treatment chamber and the buffer chamber, and a second connection tube comprising a second gas inlet is provided between the second treatment chamber and the buffer chamber,
   wherein a first composition of first gas introduced into the first connection tube from the first gas inlet is the same as a second composition of second gas which is necessary in the first treatment chamber,
   wherein a third composition of third gas introduced into the second connection tube from the second gas inlet is the same as a fourth composition of fourth gas which is necessary in the second treatment chamber,
   wherein the third composition is different from the first composition, and
   wherein the first gas and the second gas comprise argon and the third gas and the fourth gas comprise $CF_4$.

4. A substrate treatment apparatus according to claim 3, the second gas is used for sputtering and the fourth gas is used for etching a semiconductor film.

5. A substrate treatment apparatus comprising:
   at least first and second treatment chambers;
   at least one buffer chamber;
   an exhaust system connected to said buffer chamber;

a first connection tube connected with the first treatment chamber and said buffer chamber;

a second connection tube connected with the second treatment chamber and said buffer chamber;

a first gas inlet connected to said first connection tube for introducing a first gas comprising silane wherein an amorphous silicon film is formed by plasma CVD in the first treatment chamber using said first gas;

a second gas inlet connected to said second connection tube for introducing a second gas comprising silane and a doping gas wherein an amorphous silicon film having an n-type or p-type conductivity type is formed by plasma CVD in the second treatment chamber using the second gas.

6. The substrate treatment chamber according to claim 5 wherein said doping gas comprises $PH_3$.

7. The substrate treatment chamber according to claim 5 wherein said doping gas comprises $B_2H_6$.

8. The substrate treatment chamber according to claim 5 wherein a first composition of the first gas is the same as a composition of a gas which is necessary in the first treatment chamber.

9. The substrate treatment chamber according to claim 5 wherein a second composition of the second gas is the same as a composition of a gas which is necessary in the second treatment chamber.

10. A substrate treatment apparatus comprising:

at least first and second treatment chambers;

at least one buffer chamber;

an exhaust system connected to said buffer chamber;

a first connection tube connected with the first treatment chamber and said buffer chamber;

a second connection tube connected with the second treatment chamber and said buffer chamber;

a first gas inlet connected to said first connection tube for introducing a first gas comprising argon wherein an aluminum film is formed by sputtering in the first treatment chamber using said first gas;

a second gas inlet connected to said second connection tube or introducing a second gas comprising argon and oxygen wherein a conductive oxide film is formed by sputtering in the second treatment chamber using the second gas.

11. The substrate treatment chamber according to claim 10 wherein a first composition of the first gas is the same as a composition of a gas which is necessary in the first treatment chamber.

12. The substrate treatment chamber according to claim 10 wherein a second composition of the second gas is the same as a composition of a gas which is necessary in the second treatment chamber.

13. A substrate treatment apparatus comprising:

at least first and second treatment chambers;

at least one buffer chamber;

an exhaust system connected to said buffer chamber;

a first connection tube connected with the first treatment chamber and said buffer chamber;

a second connection tube connected with the second treatment chamber and said buffer chamber;

a first gas inlet connected to said first connection tube for introducing a first gas comprising argon and oxygen wherein a conductive oxide film is formed by sputtering in the first treatment chamber using said first gas;

a second gas inlet connected to said second connection tube for introducing a second gas comprising oxygen and an etching gas wherein an etching is performed in the second treatment chamber using the second gas.

14. The substrate treatment chamber according to claim 13 wherein a first composition of the first gas is the same as a composition of a gas which is necessary in the first treatment chamber.

15. The substrate treatment chamber according to claim 13 wherein a second composition of the second gas is the same as a composition of a gas which is necessary in the second treatment chamber.

16. The substrate treatment chamber according to claim 13 wherein said etching gas comprises $CF_4$.

* * * * *